(12) United States Patent
Park et al.

(10) Patent No.: US 7,881,129 B2
(45) Date of Patent: Feb. 1, 2011

(54) HIGH VOLTAGE REGULATOR FOR NON-VOLATILE MEMORY DEVICE

(75) Inventors: Sang-kug Park, Bucheon-si (KR); Dae-han Kim, Namyangju-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 261 days.

(21) Appl. No.: 12/010,247

(22) Filed: Jan. 23, 2008

(65) Prior Publication Data

US 2008/0180997 A1    Jul. 31, 2008

(30) Foreign Application Priority Data

Jan. 26, 2007    (KR) .................. 10-2007-0008607

(51) Int. Cl.
*G11C 5/14*    (2006.01)
(52) U.S. Cl. .................. 365/189.09; 365/226; 365/227; 365/196; 365/207
(58) Field of Classification Search .............. 365/185.2, 365/189.07, 189.09, 226, 185.9, 185.21, 365/196, 207
See application file for complete search history.

(56) References Cited

U.S. PATENT DOCUMENTS

| | | | | |
|---|---|---|---|---|
| 5,822,247 A * | 10/1998 | Tassan Caser et al. | . | 365/185.18 |
| 6,600,692 B2 | 7/2003 | Tanzawa | | |
| 7,420,856 B2 * | 9/2008 | Chae et al. | ............. | 365/189.09 |
| 2006/0133149 A1 * | 6/2006 | Chae et al. | ............. | 365/185.18 |
| 2007/0053228 A1 * | 3/2007 | Nam et al. | ............. | 365/189.09 |

FOREIGN PATENT DOCUMENTS

| | | |
|---|---|---|
| JP | 2002-258955 | 9/2002 |
| JP | 2003-015751 | 1/2003 |
| KR | 100223480 B1 | 7/1999 |
| KR | 10-2003-0002732 A | 1/2003 |

* cited by examiner

*Primary Examiner*—Pho M Luu
*Assistant Examiner*—Tha-O Bui
(74) *Attorney, Agent, or Firm*—Lee & Morse, P.C.

(57) ABSTRACT

A high voltage regulator may include a first regulating unit, a second regulating unit, and an output node. The first regulating unit regulates the program voltage in a voltage-level-up interval of a program voltage of a memory cell. The second regulating unit regulates the program voltage in a voltage-level-down interval of the program voltage. The output node outputs the regulated program voltage.

16 Claims, 2 Drawing Sheets

HIGH VOLTAGE REGULATOR FOR NON-VOLATILE MEMORY DEVICE

BACKGROUND OF THE INVENTION

1. Field of the Invention

Embodiments relate to a semiconductor memory device. More particularly, embodiments relate to a high voltage regulator for a non-volatile memory device capable of rapidly and accurately regulating a program voltage.

2. Description of the Related Art

A flash memory is a high-density and non-volatile memory capable of electrically storing data and programming. Data may be freely written and deleted in the flash memory like a RAM. The flash memory may maintain data stored in a chip without power like a ROM. Therefore, flash memories are widely used as memory devices in portable electronic products, e.g., digital cameras, personal digital assistants (PDAs), MP3 players, and the like.

A single level cell (SLC) flash memory is a flash memory storing one bit of data in one memory cell. A multi level cell (MLC) flash memory is a flash memory storing more than 1 bit of data in one memory cell so as to improve packing density.

When 1-bit data is stored in a flash memory, each memory cell may have a threshold voltage that falls within one of two threshold voltage distributions, which correspond to data 1 or data 0. When 2-bit data is stored in a flash memory, each memory cell may have a threshold voltage falling within one of four threshold voltage distributions. When 3-bit data is stored in a flash memory, each memory cell may have a threshold voltage falling within one of eight threshold voltage distributions, and so forth.

In a flash memory including the SLC or the MLC, the data stored in the memory cell may be read by monitoring cell currents when a read operation is performed. The read operation of a SLC flash memory and a MLC flash memory is not described in more detail here because the operation is familiar to those skilled in the art.

High voltage is required for performing programming and verify operations of the flash memory cell. A program voltage for a flash memory device is generated by a high voltage regulator. The high voltage regulator also generates a verify voltage by leveling down the high program voltage to a predetermined level and then leveling up the high program voltage. Using the verify voltage, whether programming has been accurately performed or not may be determined. Generally, the verify voltage is lower than the program voltage.

In a conventional high voltage generator, a node at which the program voltage is sensed and a node at which discharge occurs are different. Therefore, the response difference between the two nodes may result in an overdischarge or an overshooting of the program voltage. Furthermore, the conventional high voltage regulator includes resistors having a relatively large resistance value to reduce an active current. The large resistance value increases the response difference between the two nodes.

The overdischarge and the overshooting of the program voltage are becoming more significant problems as ensuring a program margin of a MLC flash memory becomes more important. The MLC flash memory requires an accurate program and an accurate verify operation.

In addition, the conventional high voltage regulator includes different comparators for detecting a low voltage and a high voltage. Therefore, mismatch between the comparators may cause malfunction of the conventional high voltage regulator.

SUMMARY OF THE INVENTION

Embodiments of the present invention are therefore directed to a high voltage regulator, which substantially overcomes one or more of the problems due to the limitations and disadvantages of the related art.

It is therefore a feature of an embodiment to provide a high voltage regulator that more stably generates a program voltage for a non-volatile memory device for ensuring a program margin of error in regulating the program voltage.

It is therefore another feature of an embodiment to provide a high voltage regulator that senses a level of the program voltage and discharges the program voltage at a same node.

It is therefore yet another feature of an embodiment to provide a high voltage regulator that senses the level of the program voltage which is raised and reduced using a same comparator.

At least one of the above and other advantages may be realized by providing a high voltage regulator including a first regulating unit configured to regulate a program voltage applied to a memory cell in a voltage-level-up interval of the program voltage, a second regulating unit configured to regulate the program voltage in a voltage-level-down interval of the program voltage, and an output node configured to output the regulated program voltage.

Each of the first and second regulating units may include a division circuit configured to divide the program voltage in a predetermined ratio to generate a division voltage. Each of the division circuits of the first and second regulating units may include a plurality of resistors connected in series, with a resistance of the division circuit of the first regulating unit being larger than a resistance of the division circuit of the second regulating unit.

Each of the division circuits of the first and second regulating units may further include a plurality of switches, each switch being connected to both ends of a corresponding resistor to adjust the level of the division voltage.

Each of the division circuits of the first and second regulating units may generate the division voltage by dividing the program voltage in the same ratio. Each of the division circuits of the first and second regulating units is connected to the output node, a division node generating the division voltage, and a ground node.

The first regulating unit may raise the program voltage in response to a result of comparing the division voltage with a first reference voltage. The first regulating unit further may include a comparator configured to output a predetermined logic level according to the result of comparing the division voltage with the first reference voltage, and a transistor configured to be turned on/off in response to the result. The comparator may be an operational amplifier configured to receive the division voltage at an inverting terminal and the first reference voltage at a non-inverting terminal.

The second division circuit may further include a switch turned on in the voltage-level-down interval. The second regulating unit may include a comparator comparing the division voltage with a second reference voltage, and a control signal generating circuit generating a control signal controlling the switch in response to a comparison result of the comparator.

The control signal generating circuit may include a flip-flop. The discharge start signal may be enabled when a first enable signal activated in the voltage-level-up interval is inactivated. A voltage-level-down interval may be defined to be from when a discharge start signal is inactivated to when the first enable signal is activated.

The control signal may be enabled from when the discharge start signal is activated to when the level of the program voltage reaches a lowest level. The comparator may be an operational amplifier configured to receive the division voltage at an inverting terminal and the first reference voltage at a non-inverting terminal.

The high voltage regulator may include a sensing unit configured to sense whether the level of the program voltage has reached a target level and sense the voltage-level-down interval of the program voltage. The sensing unit may include a reference voltage selector configured to select one of second and third reference voltages in response to a first enable signal representing the voltage-level-up interval and a second enable signal representing the voltage-level-down interval, a comparator configured to compare the level of the selected reference voltage with the division voltage, and an output configured to output a comparison result of the comparator as one of a program voltage output signal and a control signal activating the second regulating unit in response to the first and second enable signals.

Each of the level of the second and third reference voltages may be smaller than a first reference voltage used in the first regulating unit. The level of the second reference voltage may be smaller than the third reference voltage. The comparator may be shared by the sensing unit and the second regulating unit.

At least one of the above and other advantages may be realized by providing a high voltage regulator for a non-volatile memory device, the high voltage regulator including a common node through which a program voltage is discharged and a level of the program voltage is sensed.

At least one of the above and other advantages may be realized by providing a high voltage regulator for a non-volatile memory device, the high voltage regulator including a sensing circuit sensing both a level of a program voltage in a voltage-level-up interval and a level of the program voltage in a voltage-level-down interval to regulate the program voltage applied to the non-volatile memory device by raising or reducing the program voltage.

The sensing circuit may include a selector configured to select one of first and second reference voltages in response to a first enable signal representing the voltage-level-up interval of the program voltage and a second enable signal representing the voltage-level-down interval of the program voltage, a comparator configured to compare a level of the selected reference voltage with a division voltage, the division voltage being generated by dividing the program voltage by a predetermined ratio, and an output configured to output an output of the comparator as one of a program voltage output signal and a control signal that controls reducing the program voltage, the output operating in response to the first and second enable signals.

BRIEF DESCRIPTION OF THE DRAWINGS

The above and other features and advantages of embodiments will become more apparent to those of ordinary skill in the art by describing in detail exemplary embodiments thereof with reference to the attached drawings, in which.

DETAILED DESCRIPTION OF THE INVENTION

Figure 1:
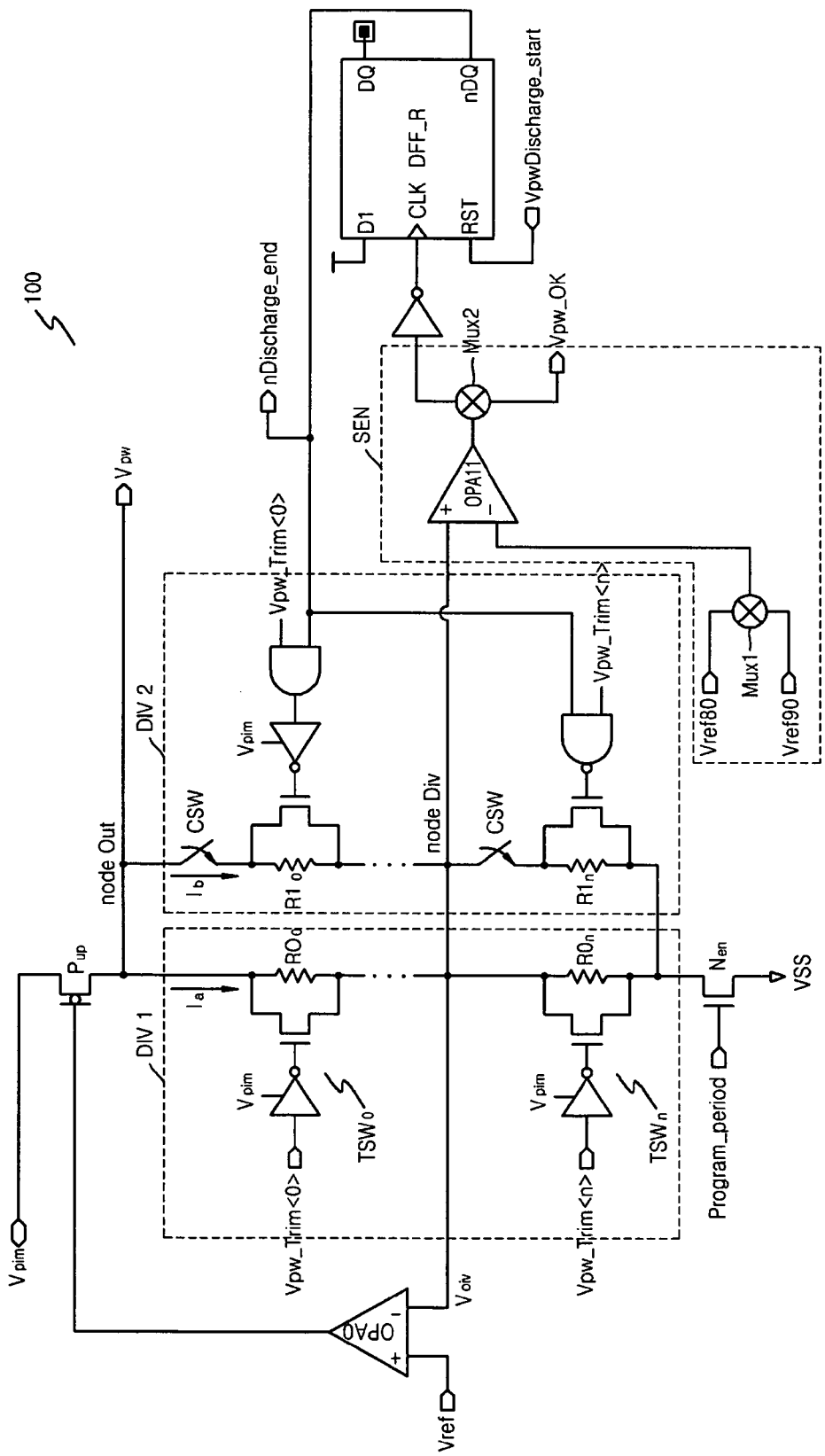
FIG. 1 illustrates a circuit diagram of a high voltage regulator according to an embodiment.

Korean Patent Application No. 10-2007-0008607, filed on Jan. 26, 2007, in the Korean Intellectual Property Office, and entitled: "High Voltage Regulator for Non-Volatile Memory Device," is incorporated by reference herein in its entirety.

Embodiments will now be described more fully hereinafter with reference to the accompanying drawings, in which exemplary embodiments of the invention are illustrated. Embodiments may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In accordance with embodiments, a high voltage regulator for a non-volatile memory device may sense a level of the program voltage and may discharge the program voltage in the same node. Therefore, overshooting and overdischarge of the program voltage may be reduced or prevented. In addition, the high voltage regulator for the non-volatile memory device according to embodiments may sense the raised and reduced program voltage using the same comparator. Therefore, mismatch between comparators of a conventional high voltage regulator may be avoided. As a result, the high voltage regulator for the non-volatile memory device according to embodiments may more accurately raise and reduce the program voltage.

FIG. 1 illustrates a circuit diagram of a high voltage regulator 100 according to an embodiment. Referring to FIG. 1, the high voltage regulator 100 may include a first regulating unit, a second regulating unit, and an output node "node Out."

The first regulating unit may regulate a program voltage $V_{pw}$ in a voltage-level-up interval of the program voltage $V_{pw}$, i.e., when the program voltage $V_{pw}$ is being increased. The second regulating unit may regulate the program voltage $V_{pw}$ in a voltage-level-down interval of the program voltage $V_{pw}$, i.e., when the program voltage $V_{pw}$ is being decreased. The output node "node Out" outputs the regulated program voltage $V_{pw}$ to a memory cell (not shown). The memory may be a non-volatile memory. More particularly, the memory may be a MLC NOR flash memory.

The first regulating unit may include a comparator OPA0, a transistor $P_{up}$, and a first division circuit DIV 1. The first division circuit DIV 1 may include a plurality of resistors ($R0_0$ through $R0_n$). The resistors ($R0_0$ through $R0_n$) may be connected in series between the output node "node OUT" and an NMOS transistor $N_{en}$. The first division circuit DIV 1 may further include switches ($TSW_0$ through $TSW_n$).

The second regulating unit may include a comparator OPA11, a second division circuit DIV 2, and a control signal generating circuit DFF_R. The second division circuit DIV 2 may include a plurality of resistors ($R1_0$ through $R1_n$) connected in series between the output node "node OUT" and the NMOS transistor $N_{en}$. The second division circuit may also include switches CSW connected between the output node "node OUT" and the first resistor $R1_0$, and between the division node "node Div" and an nth resistor $R1_n$.

The first and second division circuits DIV 1 and DIV 2 may output a division voltage $V_{div}$ generated therein through a common division node "node Div". In addition, as described below, although resistance values of the first division circuit DIV 1 may be different from that of the second division circuit DIV 2, the first and second division circuits DIV 1 and DIV 2 may generate the division voltage $V_{div}$ having the same resistance ratio. The NMOS transistor $N_{en}$ may be connected between the first and second division circuit DIV 1 and DIV 2, and a ground voltage VSS.

Figure 2:
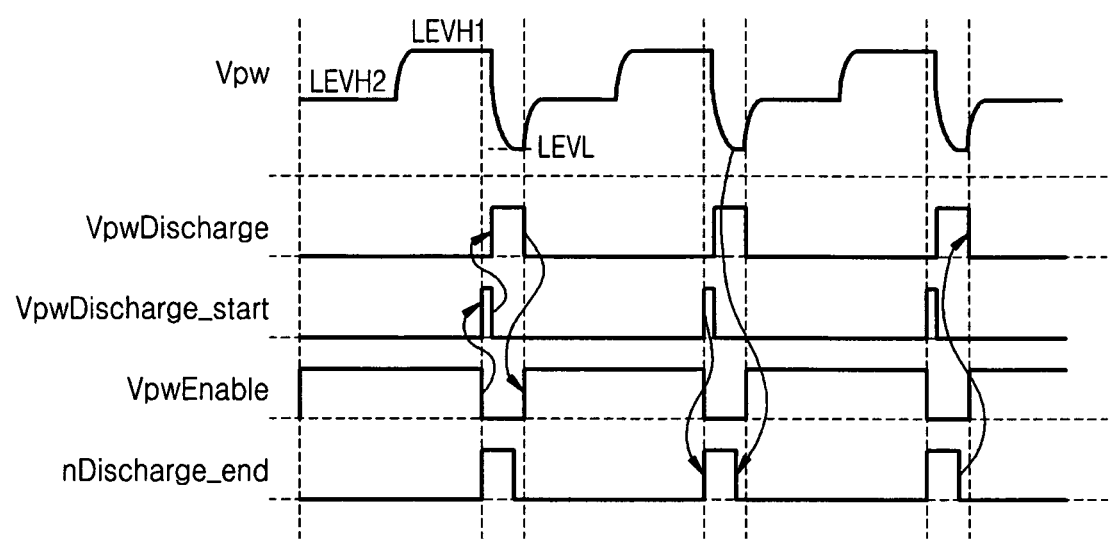
FIG. 2 illustrates a timing graph of the operation of the high voltage regulator of FIG. 1.

FIG. 2 illustrates a timing graph of operation of the high voltage regulator 100 of FIG. 1. Referring to FIGS. 1 and 2, operation of the high voltage regulator 100 according to an embodiment will now be described.

The first and second regulating units regulate the program voltage $V_{pw}$ by sensing the level of the program voltage $V_{pw}$. The sensing of the level of the program voltage $V_{pw}$ includes responding to the activation of a corresponding enable signal among a first enable signal $V_{pw}$Enable and a second enable signal $V_{pw}$Discharge, and comparing a division voltage $V_{div}$ with a corresponding first reference voltage $V_{ref}$.

In the high voltage regulator 100 shown in FIG. 1, the first regulating unit raises the program voltage $V_{pw}$ when the first enable signal $V_{pw}$Enable is activated. The first regulating unit may raise the program voltage $V_{pw}$ by responding to the result of comparing the division voltage $V_{div}$ with the first reference voltage $V_{ref}$. When the first enable signal $V_{pw}$Enable is logic HIGH "H", i.e., during a voltage-level-up interval, the comparator OPA0 may output a predetermined logic level as the result of comparing the division voltage $V_{div}$ with the first reference voltage $V_{ref}$.

In FIG. 1, the comparator OPA0 is illustrated as an operational amplifier (op amp) receiving the division voltage $V_{div}$ at an inverting terminal and the first reference voltage $V_{ref}$ at a non-inverting terminal. Therefore, the comparator OPA0 outputs logic LOW "L" when the reference voltage $V_{ref}$ is larger than the division voltage $V_{div}$ and outputs the logic HIGH "H" when the division voltage $V_{div}$ is larger than the reference voltage $V_{ref}$.

The transistor $P_{up}$ is turned on when the comparator OPA0 outputs the logic LOW "L". As the transistor $P_{up}$ is turned on, the program voltage $V_{pw}$ is raised from a predetermined voltage LEVH2 to a predetermined voltage LEVH1.

The transistor $N_{en}$ may be turned on in response to a third enable signal Program_period. The third enable signal Program_period may be activated when the high voltage regulator 100 generates the program voltage $V_{pw}$.

An active current $I_a$ may flow through the first division circuit DIV 1. The switches ($TSW_0$ through $TSW_n$) may control the size of the division voltage $V_{div}$ and may be connected to both ends of a corresponding resistor ($R0_0$ to $R0_n$). The value of a resistance corresponding to the NMOS transistor $N_{en}$ may be neglected. The switches ($TSW_0$ through $TSW_n$) in FIG. 1 are illustrated as NMOS transistors that are turned on by responding to a corresponding program voltage trim signal $V_{pw\_}$Trim. Therefore, the resistance ratio of the first division circuit DIV 1 may be adjusted. Therefore, the high voltage regulator 100 may generate the program voltage $V_{pw}$ having a verify voltage which is of a level LEVH2 different from a level LEVH1.

As the program voltage $V_{pw}$ is raised, the level of the division voltage $V_{div}$ increases. When the division voltage $V_{div}$ is greater than the first reference voltage $V_{ref}$, the OP amp OPA0 outputs the logic HIGH "H", and the PMOS transistor $P_{up}$ is turned off. Therefore, the first regulating unit stops raising the program voltage $V_{pw}$.

When the program voltage $V_{pw}$ is raised to a target level by the first regulating unit through the operation described above, a program voltage output signal $V_{pw\_}$OK is output. The memory cell (not shown) responds to the program voltage output signal $V_{pw\_}$OK to be programmed using the program voltage $V_{pw}$, which is at the target level.

The high voltage regulator 100 according to an embodiment invention may further include a sensing unit SEN sensing whether the program voltage $V_{pw}$ has reached the target level and generating the program voltage output signal $V_{pw\_}$OK. The sensing unit SEN will be described in more detail below.

When the first enable signal $V_{pw}$Enable transitions to logic LOW "L", a discharge start signal $V_{pw}$Discharge_start is activated. As the discharge start signal $V_{pw}$Discharge_start is output, the second regulating unit is activated.

The second regulating unit operates by responding to the result of comparing a predetermined reference voltage with the division voltage $V_{div}$, as does the first regulating unit. The predetermined reference voltage may be a second reference voltage $V_{ref80}$ which is 80% of the first reference voltage $V_{ref}$. The operation of the second regulating unit will now be described.

The comparator OPA11 may be shared by the second regulating unit and the sensing unit SEN. The comparator OPA11 in FIG. 1 is illustrated as an op amp OPA11 receiving the division voltage $V_{div}$ at the inverting terminal and the second reference voltage $V_{ref80}$ at the non-inverting terminal. Therefore, when the division voltage $V_{div}$ is larger than the second reference voltage $V_{ref80}$, the OP amp OPA11 outputs the logic HIGH "H".

As described below, although the resistance value of the first division circuit DIV 1 may be different from that of the second division circuit DIV 2, the first and second division circuits DIV 1 and DIV 2 may generate the division voltage $V_{div}$ in the same resistance ratio. In particular, the resistance value of the series of resistors ($R0_0$ through $R0_n$) of the first division circuit DIV 1 may be larger than that of the series of resistors ($R1_0$ through $R1_n$) of the second division circuit DIV 2. The operation and the function of the second division circuit DIV 2 is similar to the first division circuit DIV 1, and thus will be not described in detail.

The resistance value of the second division circuit DIV 2 may be designed to be very small in comparison with that of the first division circuit DIV 1. Therefore, when the switches CSW are turned on in response to a control signal nDischarge_end at logic HIGH "H", the second division circuit DIV 2 is activated, and a current $I_b$ of the second division circuit DIV 2 is increased from the output node "node OUT" to the ground voltage VSS. Hereinafter, the current $I_b$ flowing through the second division circuit DIV 2 will be referred to as a discharge current $I_b$.

The second division circuit DIV 2 may reduce the program voltage $V_{pw}$ using the discharge current $I_b$. As the program voltage $V_{pw}$ is reduced, the level of the division voltage $V_{div}$ decreases. When the division voltage $V_{div}$ is smaller than that of the second reference voltage $V_{ref80}$, the OP amp OPA11 outputs logic LOW "L", and the control signal nDischarge_end is disabled. Therefore, the switches CSW are turned off. Thus, the discharge operation is stopped. The control signal nDischarge_end will now be described in more detail.

Referring to FIGS. 1 and 2, the second regulating unit may further include a control signal generating circuit DFF_R generating the control signal nDischarge_end. The control signal generating circuit DFF_R in FIG. 1 is illustrated as a D flip-flop. The control signal generating circuit DFF_R responds to the comparison result of the OP amp OPA11 and the discharge start signal $V_{pw}$Discharge_start, and generates the control signal nDischarge_end.

As described above, the discharge start signal $V_{pw}$Discharge_start is activated when the first enable signal $V_{pw}$Enable is disabled. When the discharge start signal $V_{pw}$Discharge_start is transitioned to logic LOW "L" again, the second enable signal $V_{pw}$Discharge is activated. The second enable signal $V_{pw}$Discharge is activated in the voltage-level-down interval. The OP amp OPA11 responds to the activation of the second enable signal $V_{pw}$Discharge to operate.

When the division voltage $V_{div}$ is larger than the second reference voltage $V_{ref80}$, the comparator OPA11 outputs logic HIGH "H" to the control signal generating circuit DFF_R, and the control signal generating circuit DFF_R outputs the control signal nDischarge_end at logic HIGH "H". As described above, when the control signal nDischarge_end at logic HIGH "H" is applied to the switch CSW, the second division circuit DIV 2 reduces the program voltage $V_{pw}$. When the level of the division voltage $V_{div}$ is reduced to be smaller than the second reference voltage $V_{ref80}$, and the comparator OPA11 outputs logic LOW "L" to the control signal generating circuit DFF_R. Therefore, the control signal nDischarge_end is logic HIGH "H" from when the discharge start signal $V_{pw}$Discharge_start is activated to when the program voltage $V_{pw}$ reaches a minimum level LEVL.

When the program voltage $V_{pw}$ reaches the minimum level LEVL, the control signal nDischarge_end is transitioned to logic LOW "L", and then the first enable signal $V_{pw}$Enable is activated. Therefore, the voltage-level-down interval is defined to be from when the discharge start signal $V_{pw}$Discharge_start is inactivated to when the first enable signal $V_{pw}$Enable is activated.

The high voltage regulator according to an embodiment may perform the increasing regulating through a path having relatively large resistance values and the reducing regulating through a path having relatively small resistance values. Therefore, the high voltage regulator 100 according to an embodiment may discharge the program voltage $V_{pw}$ and sense the level of the program voltage $V_{pw}$ through the same node "node Out". Therefore, the overdischarge and the overshooting caused by the response lag between the two nodes generated in the conventional high voltage regulator may be reduced or prevented.

Referring to FIGS. 1 and 2, as described above, the high voltage regulator 100 according to an embodiment may further include the sensing unit SEN. The sensing unit SEN may sense the level of the program voltage $V_{pw}$ in the voltage-level-up interval and in the voltage-level-down interval. That is, the sensing unit SEN senses whether the program voltage $V_{pw}$ has reached the predetermined voltage LEVH1 level and the minimum level LEVL.

The sensing unit SEN may include a reference voltage selection element Mux1, the comparator OPA11, and an output element Mux2. The reference voltage selection element Mux1 or the output element Mux2 may each be a multiplexer or a switch. The reference voltage selection element Mux1 selects one of the second reference voltage $V_{ref80}$ and a third reference voltage $V_{ref90}$ in response to the first and second enable signals $V_{pw}$Enable and $V_{pw}$Discharge. The first enable signal $V_{pw}$Enable represents the voltage-level-up interval, and the second enable signal $V_{pw}$Discharge represents the voltage-level-down interval.

In detail, the reference voltage selection element Mux1 may select the third reference voltage $V_{ref90}$ when the first enable signal $V_{pw}$Enable is high. The reference voltage selection element Mux1 may select the second reference voltage $V_{ref80}$ when the second enable signal $V_{pw}$Discharge is high. The second reference voltage $V_{ref80}$ may be the second reference voltage $V_{ref80}$ as described above. The third reference voltage $V_{ref90}$ may be 90% of the first reference voltage $V_{ref}$.

The comparator shared by the sensing unit SENS and the second regulating unit, i.e., the OP amp OPA11, has been already described above. The OP amp OPA11 senses the voltage-level-down interval. In addition, the OP amp OPA11 may compare a reference voltage selected by the reference voltage selection element Mux1 with the division voltage $V_{div}$ so as to sense whether the program voltage $V_{pw}$ has reached the target level.

The output element Mux2 responds the first and second enable signals $V_{pw}$Enable and $V_{pw}$Discharge, and outputs the comparison result of the OP amp OPA11 as one of the program voltage output signal $V_{pw}$_OK and a signal for clocking the D flip-flop DFF_R. In particular, the output element Mux2 may output the comparison result as the program voltage output signal $V_{pw}$_OK when the first enable signal $V_{pw}$Enable is high. The output element Mux2 may output the signal for clocking the D flip-flop DFF_R when the second enable signal $V_{pw}$Discharge is high.

As described above, the high voltage regulator for the non-volatile memory device according to the present invention senses the level of the program voltage and discharges the program voltage in the same node. Therefore, overshooting and overdischarge of the program voltage can be prevented. In addition, the high voltage regulator for the non-volatile memory device according to the present invention senses the level of the program voltage which is raised and reduced using the same OP amp. Therefore, mismatch generated between OP amps of a conventional high voltage regulator is prevented. As a result, the high voltage regulator for the non-volatile memory device according to the present invention can more accurately raise and reduce the program voltage.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A high voltage regulator, comprising:
    a first regulating unit configured to compare a division voltage with a first reference voltage and to regulate a program voltage applied to a memory cell in a voltage-level-up interval of the program voltage based on the result of the comparing the division voltage with the first reference voltage;
    a second regulating unit configured to compare the division voltage with a second reference voltage and to regulate the program voltage in a voltage-level-down interval of the program voltage;
    a sensing unit; and
    an output node configured to output the regulated program voltage,
    wherein the sensing unit and the second regulating unit share a comparator that compares the division voltage with one of the second reference voltage and a third reference voltage.

2. The high voltage regulator as claimed in claim 1, wherein each of the first and second regulating units comprises a division circuit configured to divide the program voltage in a predetermined ratio to generate the division voltage.

3. The high voltage regulator as claimed in claim 2, wherein each of the division circuits of the first and second regulating units comprises a plurality of resistors connected in series, with a resistance of the division circuit of the first regulating unit being larger than a resistance of the division circuit of the second regulating unit.

4. The high voltage regulator as claimed in claim 3, wherein each of the division circuits of the first and second regulating units further comprises a plurality of switches, each switch being connected to both ends of a corresponding resistor to adjust the level of the division voltage.

5. The high voltage regulator as claimed in claim 2, wherein each of the division circuits of the first and second regulating units generates the division voltage by dividing the program voltage in the same ratio.

6. The high voltage regulator as claimed in claim 2, wherein each of the division circuits of the first and second regulating units is connected to the output node, a division node generating the division voltage, and a ground node.

7. The high voltage regulator as claimed in claim 1, wherein the first regulating unit further comprises:
- a second comparator configured to output a predetermined logic level according to the result of comparing the division voltage with the first reference voltage; and
- a transistor configured to be turned on/off in response to the result,
- wherein the second comparator is an operational amplifier configured to receive the division voltage at an inverting terminal and the first reference voltage at a non-inverting terminal.

8. The high voltage regulator as claimed in claim 2, wherein a second division circuit further comprises a switch turned on in the voltage-level-down interval.

9. The high voltage regulator as claimed in claim 8, wherein the second regulating unit further comprises:
- the comparator comparing the division voltage with the second reference voltage; and
- a control signal generating circuit generating a control signal controlling the switch in response to a comparison result of the comparator,
- wherein the control signal generating circuit comprises a flip-flop.

10. The high voltage regulator as claimed in claim 9, wherein a discharge start signal is enabled when a first enable signal activated in the voltage-level-up interval is inactivated,
- wherein the voltage-level-down interval is defined to be from when the discharge start signal is inactivated to when the first enable signal is activated.

11. The high voltage regulator as claimed in claim 9, wherein the control signal is enabled from when a discharge start signal is activated to when the level of the program voltage reaches a lowest level.

12. The high voltage regulator as claimed in claim 9, wherein the comparator is an operational amplifier configured to receive the division voltage at an inverting terminal and the first reference voltage at a non-inverting terminal.

13. The high voltage regulator as claimed in claim 1, wherein the sensing unit is configured to sense whether the level of the program voltage has reached a target level and sense the voltage-level-down interval of the program voltage.

14. The high voltage regulator as claimed in claim 13, wherein the sensing unit comprises:
- a reference voltage selector configured to select one of the second and the third reference voltages in response to a first enable signal representing the voltage-level-up interval and a second enable signal representing the voltage-level-down interval;
- the comparator configured to compare the level of the selected reference voltage with the division voltage; and
- an output of the comparator configured to output a comparison result of the comparator as one of a program voltage output signal and a control signal activating the second regulating unit in response to the first and second enable signals.

15. The high voltage regulator as claimed in claim 14, wherein each of the level of the second and third reference voltages is smaller than a first reference voltage used in the first regulating unit, wherein the level of the second reference voltage is smaller than the third reference voltage.

16. A high voltage regulator for a non-volatile memory device, the high voltage regulator comprising:
- a sensing circuit sensing both a level of a program voltage in a voltage-level-up interval and a level of the program voltage in a voltage-level-down interval to regulate the program voltage applied to the non-volatile memory device by raising or reducing the program voltage, the sensing circuit including:
  - a selector configured to select one of first and second reference voltages in response to a first enable signal representing the voltage-level-up interval of the program voltage and a second enable signal representing the voltage-level-down interval of the program voltage;
  - a comparator configured to compare a level of the selected reference voltage with a division voltage, the division voltage being generated by dividing the program voltage by a predetermined ratio; and
  - an output configured to output an output of the comparator as one of a program voltage output signal and a control signal that controls reducing the program voltage, the output operating in response to the first and second enable signals.

* * * * *